US012720997B2

(12) United States Patent
Hu

(10) Patent No.: US 12,720,997 B2
(45) Date of Patent: Aug. 25, 2026

(54) METHOD FOR MANUFACTURING DISPLAY PANEL WITH METAL SAPCER CONNECTED TO CATHODE

(71) Applicant: SHENZHEN CHINA STAR OPTOELECTRONICS SEMICONDUCTOR DISPLAY TECHNOLOGY CO., LTD., Shenzhen (CN)

(72) Inventor: Zehu Hu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 676 days.

(21) Appl. No.: 17/758,017

(22) PCT Filed: Jun. 6, 2022

(86) PCT No.: PCT/CN2022/097151

§ 371 (c)(1),
(2) Date: Jun. 26, 2022

(87) PCT Pub. No.: WO2023/226080

PCT Pub. Date: Nov. 30, 2023

(65) Prior Publication Data

US 2024/0196695 A1 Jun. 13, 2024

(30) Foreign Application Priority Data

May 24, 2022 (CN) ......................... 202210573106.5

(51) Int. Cl.

*H10K 59/80* (2023.01)
*H10K 59/12* (2023.01)
*H10K 59/131* (2023.01)

(52) U.S. Cl.

CPC ... *H10K 59/80522* (2023.02); *H10K 59/1201* (2023.02); *H10K 59/131* (2023.02)

(58) Field of Classification Search

CPC ......... H10K 59/80522; H10K 59/1201; H10K 59/131; H10K 50/824; H10K 59/122; H10K 71/00; H10K 59/123; H10K 59/124

See application file for complete search history.

(56) References Cited

U.S. PATENT DOCUMENTS

2015/0144902 A1 5/2015 Do et al.
2016/0351651 A1* 12/2016 Jang .................... H10K 59/131

(Continued)

FOREIGN PATENT DOCUMENTS

CN 106409870 A 2/2017
CN 109360900 A 2/2019

(Continued)

OTHER PUBLICATIONS

Liu, CN112103326A, Machine Translation (Year: 2022).*

(Continued)

*Primary Examiner* — Jacob Y Choi
*Assistant Examiner* — Grace Cha
(74) *Attorney, Agent, or Firm* — PV IP PC; Peter Stecher; Wei Te Chung

(57) ABSTRACT

A display panel, a manufacturing method thereof, and an electronic device are provided. By disconnecting a portion of the organic functional layer in the display panel positioned on the metal spacer and other parts of the organic function layer, and exposing a side of the metal spacer, a cathode and a metal spacer can be directly connected when the cathode is formed by a vapor deposition on the entire surface. There is no need for additional masks and the process of etching organic functional layers, therefore a (Continued)

manufacturing process can be simplified, and the production cost can be reduced.

8 Claims, 5 Drawing Sheets

(56) References Cited

U.S. PATENT DOCUMENTS

| | | | | |
|---|---|---|---|---|
| 2019/0115561 | A1 * | 4/2019 | Tang | H10K 59/1213 |
| 2021/0376283 | A1 * | 12/2021 | Shin | H10K 59/124 |

FOREIGN PATENT DOCUMENTS

| | | | | |
|---|---|---|---|---|
| CN | 109411610 | A | 3/2019 | |
| CN | 110911461 | A | 3/2020 | |
| CN | 111864116 | A | 10/2020 | |
| CN | 112103326 | A * | 12/2020 | H10K 59/1315 |
| CN | 113725266 | A | 11/2021 | |
| CN | 114335109 | A | 4/2022 | |
| EP | 3754711 | A1 * | 12/2020 | H01L 27/3246 |

OTHER PUBLICATIONS

Song; Yong-xi, CN-112103326-A, Machine Translation (Year: 2020).*

International Search Report in International application No. PCT/CN2022/097151, mailed on Dec. 16, 2022.

Written Opinion of the International Search Authority in International application No. PCT/CN2022/097151, mailed on Dec. 16, 2022.

Chinese Office Action issued in corresponding Chinese Patent Application No. 202210573106.5 dated May 17, 2025, pp. 1-9.

* cited by examiner

METHOD FOR MANUFACTURING DISPLAY PANEL WITH METAL SAPCER CONNECTED TO CATHODE

FIELD OF INVENTION

The present application relates to a field of display technology, and in particular, to a display panel, a manufacturing method thereof, and an electronic device.

BACKGROUND OF INVENTION

With the continuous change of display technology, the display panel is developing in a direction of multi-function and digitization. Large size, high resolution, high color saturation, energy saving, high brightness, flexibility, transparency, etc. have gradually become the mainstream trends in the development of display technology. Organic light emitting diode (OLED) display technology can finally achieve the above extreme performance. With an increase of a size of the display panel, some defects that are not prominent in a small and medium size display panel are gradually exposed. For example, a brightness uniformity of the panel is gradually deteriorated with the increase of the size of the display panel.

The reasons for the decrease in the brightness uniformity of the display panel are as follows: 1) The electrical properties of the pixel circuit of the OLED panel are not uniform which is affected by the film formation and etching uniformity of the active layer and related inorganic layers. 2) The trace resistance and parasitic capacitance increased when the metal trace becomes longer, therefore the RC loading of the panel far from the signal input terminal increased, resulting in insufficient charging of the data signal, which in turn makes the pixel current far from the input terminal lower than the pixel current close to the input terminal, resulting in brightness differences. 3) Since the OLED device is a current-driven device, each position of the display panel has different VDD/VSS voltage drops (also known as IR drop effect) when the display panel is lit according to the U=I*R formula, wherein a decrease in VDD and an increase in VSS would lower the brightness of the pixel, resulting in uneven brightness of the display panel.

For the uneven brightness caused by the IR drop effect, a resistance value can be reduced by adding an auxiliary cathode and connecting the cathode and the auxiliary cathode in parallel. Since the organic functional layer and the cathode in the OLED display panel are both evaporated on the whole surface, the organic functional layer will cover the metal spacer for connecting the cathode and the auxiliary cathode. In order to enable the cathode to be connected in parallel with the auxiliary cathode, the previously formed organic functional layer needs to be etched to expose the metal spacer, and then deposited to form the cathode. However, in this way, an additional mask plate and a process for etching the organic functional layer are required, resulting in a more complicated manufacturing process and an increase in production cost.

To sum up, the currently display panel has the problems that the organic functional layer needs to be etched in order to connect the cathode and the auxiliary cathode in parallel, which leads to more complicated manufacturing process and increased production cost. Therefore, it is necessary to provide a display panel, a manufacturing method, and an electronic device to improve the above-mentioned defect.

SUMMARY OF INVENTION

Embodiments of the present application provide a display panel, a manufacturing method thereof, and an electronic device. A cathode and a metal spacer can be directly connected when the cathode is formed on the entire surface without the need for an additional mask and the process of etching the organic functional layer, thereby the manufacturing process can be simplified and the production cost can be reduced.

One embodiment of the present application provides a display panel, including: a base substrate;

- an auxiliary cathode on the base substrate;
- an anode on the base substrate;
- a metal spacer on the base substrate; and
- an organic functional layer and a cathode sequentially stacked on the anode and the metal spacer;
- wherein the metal spacer is electrically connected to the auxiliary cathode, wherein a part of the organic functional layer on the metal spacer is disconnected from other parts of the organic functional layer, wherein a side edge of the metal spacer is exposed, and wherein the cathode is connected to the side edge of the metal spacer.

According to one embodiment of the present application, a width of a terminal of the metal spacer away from the base substrate is greater than a width of a terminal of the metal spacer close to the base substrate.

According to one embodiment of the present application, a width of the metal spacer gradually decreases from the terminal away from the base substrate to the terminal close to the base substrate.

According to one embodiment of the present application, an angle between a side edge of the metal spacer and a bottom surface on a side of the metal spacer close to the base substrate is greater than 90° and less than 180°.

According to one embodiment of the present application, a thickness of the metal spacer is greater than a thickness of the organic functional layer, and wherein a thickness of the cathode is greater than a thickness of the organic functional layer.

According to one embodiment of the present application, the display panel comprises a source electrode, a drain electrode and a signal trace, wherein the signal trace, the source electrode, and the drain electrode are disposed in a same layer, and a same material as the source electrode and the drain electrode;

wherein the metal spacer is disposed on a side of the signal trace away from the base substrate, and is connected to the signal trace, and wherein the auxiliary cathode is disposed on the side of the metal spacer close to the base substrate and connected to the signal trace.

According to one embodiment of the present application, an orthographic projection of the metal spacer on the base substrate falls within an orthographic projection of the signal trace on the base substrate.

According to one embodiment of the present application, the display panel further comprises a passivation protection layer and a planarization layer sequentially stacked on the source electrode and the drain electrode, wherein an opening is formed on and communication the passivation protection layer and the planarization layer, and wherein the opening exposes the signal trace and the metal spacer.

According to one embodiment of the present application, the display panel further comprises an auxiliary electrode, wherein the auxiliary electrode is disposed on the passivation protection layer and passes through an opening formed on the passivation protection layer connected to the source electrode;

- wherein the metal spacer and the auxiliary electrode are disposed on a same layer and have a same material.

According to one embodiment of the present application, the auxiliary electrode extends from the opening to the passivation protection layer on an outer periphery of the opening.

According to the display panel provided by the above-mentioned embodiment of the present application, the embodiment of the present application also provides a method of manufacturing a display panel, which is used to manufacture and form the display panel according to the above-mentioned embodiment, and the method of manufacturing the display panel including:

providing a substrate, the substrate comprises a base substrate and a thin film transistor array layer positioned on the substrate, wherein the thin film transistor array layer comprises an auxiliary cathode, a signal trace, and a passivation protection layer, wherein the auxiliary cathode is disposed between the signal trace and the base substrate, and electrically connected to the signal trace, wherein the passivation protection layer is disposed on a side of the signal trace away from the base substrate;

etching the passivation protection layer to form an opening penetrating through the passivation protection layer, wherein the opening exposes part of the signal trace, and wherein a width of the opening gradually decreases from a side away from the base substrate to a side close to the base substrate;

forming a metal spacer on the signal trace at the opening;

forming a planarization layer on the passivation protection layer, and etching the planarization layer to expose an upper surface of the metal spacer;

etching the passivation protection layer around the metal spacer to expose a side edge of the metal spacer;

forming an anode and a pixel definition layer in sequence on the passivation protection layer, and etching the pixel definition layer to expose the upper surface and the side of the metal spacer;

depositing an organic functional layer on the pixel definition layer, wherein a portion of the organic functional layer deposited and formed on the metal spacer is disconnected from other portions, and wherein the side edge of the metal spacer is exposed;

forming a cathode by depositing on the organic functional layer, wherein the cathode is connected to the side edge of the metal spacer.

According to one embodiment of the present application, an included angle between a side edge of the opening and the upper surface of the signal trace is less than 90°.

According to the display panel provided by the above-mentioned embodiment of the present application, the embodiment of the present application further provides an electronic device including the above-mentioned display panel. The electronic device includes a casing, a circuit board, and a display panel, wherein the circuit board is disposed in the casing, the display panel is covered on the casing, and the display panel is electrically connected to the circuit board, wherein the display panel includes:

a base substrate;

an auxiliary cathode on the base substrate;

an anode on the base substrate;

a metal spacer on the base substrate; and an organic functional layer and a cathode sequentially stacked on the anode and the metal spacer;

wherein the metal spacer is electrically connected to the auxiliary cathode, wherein a part of the organic functional layer on the metal spacer is disconnected from other parts of the organic functional layer, wherein a side edge of the metal spacer is exposed, and wherein the cathode is connected to the side edge of the metal spacer.

According to one embodiment of the present application, a width of a terminal of the metal spacer away from the base substrate is greater than a width of a terminal of the metal spacer close to the base substrate.

According to one embodiment of the present application, a width of the metal spacer gradually decreases from the terminal away from the base substrate to the terminal close to the base substrate.

According to one embodiment of the present application, an angle between a side edge of the metal spacer and a bottom surface on a side of the metal spacer close to the base substrate is greater than 90° and less than 180°.

According to one embodiment of the present application, a thickness of the metal spacer is greater than a thickness of the organic functional layer, and wherein a thickness of the cathode is greater than a thickness of the organic functional layer.

According to one embodiment of the present application, the display panel comprises a source electrode, a drain electrode and a signal trace, wherein the signal trace, the source electrode, and the drain electrode are disposed in a same layer, and a same material as the source electrode and the drain electrode;

wherein the metal spacer is disposed on a side of the signal trace away from the base substrate, and is connected to the signal trace, and wherein the auxiliary cathode is disposed on the side of the metal spacer close to the base substrate, and connected to the signal trace.

According to one embodiment of the present application, an orthographic projection of the metal spacer on the base substrate falls within an orthographic projection of the signal trace on the base substrate.

According to one embodiment of the present application, the display panel further comprises a passivation protection layer and a planarization layer sequentially stacked on the source electrode and the drain electrode, wherein an opening is formed on and communication the passivation protection layer and the planarization layer, and wherein the opening exposes the signal trace and the metal spacer.

Advantages of the embodiments of the present disclosure: The embodiments of the present application provide a display panel and a manufacturing method thereof, and an electronic device. The electronic device includes the display panel, and the display panel includes a base substrate, an auxiliary cathode on the base substrate, an anode on the base substrate, a metal spacer on the base substrate, and an organic functional layer and a cathode sequentially stacked on the anode and the metal spacer. The metal spacer is electrically connected to the auxiliary cathode. A part of the organic functional layer on the metal spacer is disconnected from other parts of the organic functional layer, wherein a side edge of the metal spacer is exposed, and wherein the cathode is connected to the side edge of the metal spacer. Therefore, there is no need to etch the organic functional layer. The cathode and the metal spacer can be directly connected when the cathode is formed by evaporation on the entire surface without the need for an additional mask and a process of etching the organic functional layer. Therefore, a manufacturing process can be simplified, and a production cost can be reduced.

DESCRIPTION OF FIGURES

In order to more clearly illustrate the embodiments or technical solutions in the prior art, the following briefly introduces the accompanying figures that are used in the description of the embodiments or the prior art. Obviously, the figures in the following description are only for disclosure. In some embodiments, for those of ordinary skill in the art, other figures can also be obtained according to these figures without any inventive steps.

DETAILED DESCRIPTION OF EMBODIMENTS

Figure 1:
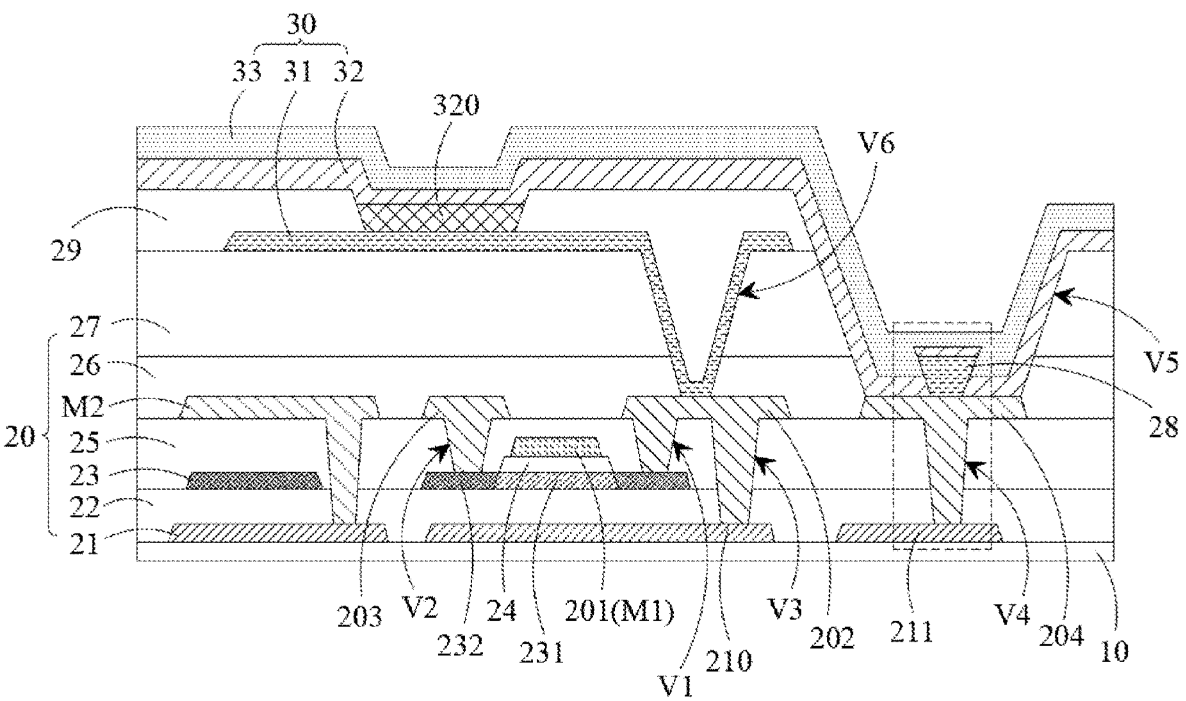
FIG. 1 is a schematic diagram of a stacked structure of the display panel provided by one embodiment of the present application.

The following descriptions of the various embodiments refer to the accompanying figures to illustrate specific embodiments in which the present disclosure may be practiced. The directional terms mentioned in this disclosure, such as up, down, front, rear, left, right, inner, outer, side, etc., are only for reference additional schema orientation. Accordingly, the directional terms re used for describing and understanding the present application, rather than to limit the present application. In the figures, structurally similar elements are denoted by the same reference numerals.

The present disclosure will be further described below in conjunction with the accompanying figures and specific embodiments:

One embodiment of the present application provides a display panel, the display panel includes a substrate, an auxiliary cathode positioned on the substrate, an anode positioned on the substrate, a metal spacer positioned on the substrate, and an organic functional layer and a cathode sequentially stacked on the anode and the metal spacer. The metal spacer is electrically connected to the auxiliary cathode, wherein a part of the organic functional layer on the metal spacer is disconnected from other parts of the organic functional layer, a side edge of the metal spacer is exposed, and wherein the cathode is connected to the side edge of the metal spacer. In this way, the cathode and the metal spacer can be directly connected when the cathode is formed on the entire surface, without the need for an additional mask and the process of etching the organic functional layer, thereby simplifying the manufacturing process and reducing the production cost.

As shown in FIG. 1, FIG. 1 is a schematic diagram of a stacked structure of the display panel provided by one embodiment of the present application. The display panel includes a base substrate 10, a thin film transistor array layer 20 disposed on the base substrate 10, and a light emitting device layer 30 disposed on the thin film transistor array layer 20.

The thin film transistor array layer 20 includes a light-shielding layer 21, a buffer layer 22, an active layer 23, a gate insulating layer 24, a first metal layer M1, an interlayer dielectric layer 25, and a second metal layer M2 which are sequentially stacked on the substrate 10.

The light-shielding layer 21 has a plurality of patterned light-shielding electrodes 210 and a patterned auxiliary cathode 211. The light-shielding electrodes 210 and the active layer 23 are arranged in alignment to prevent light from the external environment from being irradiated to the active layer 23 through the bottom of the display panel, therefore a stability of the thin film transistor device in the thin film transistor array layer 20 can be improved.

A material of the light-shielding layer 21 may be a metal material with low light transmittance and good electrical conductivity. The light-shielding layer 21 can be a single-layer metal film structure formed by any one of metal materials such as copper, aluminum, silver, molybdenum, and titanium, or can be a laminated metal thin film structure formed by any two of the above-mentioned metal materials.

A material of the active layer 23 may be a metal oxide semiconductor material, and the metal oxide semiconductor material may be any one of indium zinc oxide (IZO), indium gallium zinc oxide (IGZO), and indium gallium zinc tin oxide (IGZTO) oxide.

The active layer 23 includes a channel portion 231 and conductor portions 232 positioned on both sides of the channel portion 231.

The first metal layer M1 includes a patterned gate electrode 201 and a plurality of laterally spaced scan lines. The first metal layer M1 may be a single-layer metal film structure formed by any one of metal materials such as copper, aluminum, silver, molybdenum, and titanium, or may be a stack layered metal film structure formed by any two of the above-mentioned metal materials.

The second metal layer M2 includes a patterned source electrode 202 and a patterned drain electrode 203. The source electrode 202 is connected to the conductor portion 232 on a side of the channel portion 231 through a first opening V1 penetrating the interlayer dielectric layer 25. The drain electrode 203 is connected to the conductor portion 232 on the other side of the channel portion 231 through a second opening V2 penetrating the interlayer dielectric layer 25.

The second metal layer M2 may be a single-layer metal film structure formed by any one of metal materials such as copper, aluminum, silver, molybdenum, and titanium, or may be a stack layered metal film structure formed by any two of the above-mentioned metal materials.

The source electrode 202 can also be connected to the light-shielding layer 21 at a bottom of the active layer 23 through the third opening V3 penetrating the interlayer dielectric layer 25 and the buffer layer 22, to make the voltages of the light-shielding layer 21 and the source electrode 202 the same during an operation of the display panel, a parasitic capacitance between the light shielding layer 21 and other conductive structures in the display panel can be avoided.

The second metal layer M2 also includes signal traces 204 and a plurality of data signal traces (not shown in the figure). The signal trace 204 is connected to the auxiliary cathode 211 located under the signal trace 204 through a fourth opening V4 penetrating the interlayer dielectric layer 25 and the buffer layer 22. The signal trace 204 is used to transmit a constant power supply low voltage signal VSS.

The display panel further includes a passivation protection layer 26 and a planarization layer 27 which are sequentially stacked on the source electrode 202 and the drain electrode 203. A fifth opening V5 is provided on the passivation protection layer 26 and the planarization layer 27, the fifth opening exposes the signal trace 204 under the passivation protection layer 26.

The display panel further includes a metal spacer 28. The metal spacer 28 is disposed in the fifth opening V5 and positioned on a side of the signal trace 204 away from the base substrate 10, and the metal spacer 28 is electrically connected to the signal trace 204.

The light emitting device layer 30 may include a plurality of light emitting devices. The light emitting devices are organic light emitting diodes. The light emitting device layer 30 includes an anode 31. The anode 31 is disposed on a side of the planarization layer 27 away from the base substrate 10. The anode 31 is connected to the source electrode 202 through a sixth opening V6 penetrating the flat layer 27 and the passivation protection layer 26.

The display panel further includes a pixel definition layer 29. The pixel definition layer 29 is disposed on the side of the planarization layer 27 away from the base substrate 10 and covers the anode 31. The pixel definition layer 29 is provided with a plurality of pixel openings, and the pixel openings expose part of the anode 31.

The light-emitting device layer 30 includes an organic functional layer 32. The organic functional layer 32 includes a hole injection layer, a hole transport layer, an organic light-emitting material layer 320, an electron transport layer, and an electron injection layer that are stacked in sequence. The light-emitting material layer 320 is only disposed in the pixel opening. The hole injection layer, the hole transport layer, the electron transport layer, and the electron injection layer are all manufactured by full-surface evaporation, and cover the pixel definition layer 29 and the anode 31 on the entire surface.

The light emitting device layer 30 further includes a cathode 33 disposed on a side of the organic functional layer 32 away from the base substrate 10. The cathode 33 can also be manufactured by vapor deposition on the entire surface, and the entire surface covers the organic functional layer 32.

Figure 2:
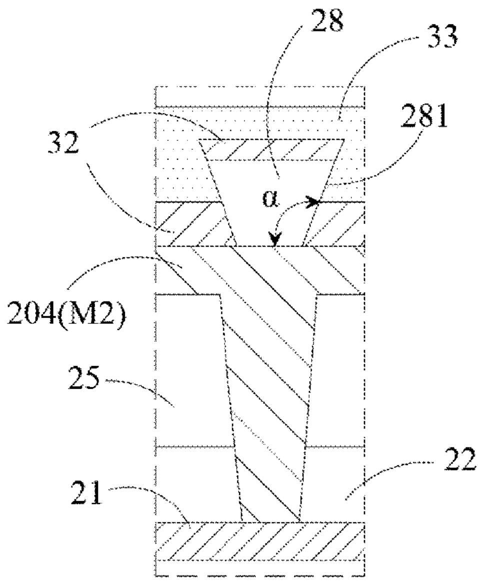
FIG. 2 is a partial schematic diagram of an opening provided in one embodiment of the present application.

Further, as shown in FIG. 1 and FIG. 2, FIG. 2 is a partial schematic diagram of an opening provided in one embodiment of the present application. The organic functional layer 32 is disposed on a sidewall of the fifth opening V5 and the signal trace 204 at a bottom of the fifth opening V5. The organic functional layer 32 is also disposed on a surface of a side of the metal spacer 28 away from the base substrate 10.

A portion of the organic functional layer 32 disposed on a side of the metal spacer 28 away from the base substrate 10 is disconnected from a portion of the organic functional layer 32 disposed on the signal trace 204, and expose a side edge 281 of the metal spacer 28.

The cathode 33 is disposed on the organic functional layer 32 and connected to the side edge 281 of the metal spacer 28, so that the cathode 33 can receive the power supply low voltage signal VSS transmitted by the signal trace 204. The cathode 33 and the auxiliary cathode 211 are connected to the signal trace 204 in parallel, so that a resistance value in the pixel circuit can be reduced, so as to improve an uneven display brightness caused by an increase of the resistance due to the thinning of the cathode.

Further, a width of a terminal of the metal spacer 28 away from the base substrate 10 is greater than a width of a terminal of the metal spacer 28 close to the base substrate 10. In this way, the larger width of one terminal of the metal spacer 28 close to the base substrate 10 can be used to form a shield under an orthographic projection of the metal spacer 28 to prevent the organic functional layer 32 from being deposited under the metal spacer 28. Therefore, the organic functional layer 32 can form a fault on the top and side of the metal spacer 28, thereby exposing a side edge of the metal spacer 28, so as to ensure that the cathode 33 formed by subsequent deposition can connect with the side edge 281 of the metal spacer 28.

Further, a width of the metal spacer 28 gradually decreases from the terminal away from the base substrate 10 to the terminal close to the base substrate 10. In the cross-sectional views shown in FIGS. 1 and 2, a cross-sectional shape of the metal spacer 28 is an inverted trapezoid, and the inverted trapezoid may be an isosceles trapezoid.

In one embodiment, a three-dimensional shape of the metal spacer 28 may be an inverted truncated cone, and a diameter of the circular truncated cone gradually decreases from the terminal away from the base substrate 10 to the terminal close to the base substrate 10.

In one embodiment, the three-dimensional shape of the metal spacer 28 can be an inverted terrace shape, and it is only required that the distance between any opposite sides of the platform gradually decreases from the terminal away from the base substrate 10 to the terminal close to the base substrate 10, and it is also possible to make the organic functional layer 32 form a fault on the top surface and the side edge of the metal spacer 28, so that the cathode 33 can be overlapped with the side edge of the metal spacer 28.

Further, as shown in FIG. 2, the included angle between the side edge 281 of the metal spacer 28 and the bottom surface of the metal spacer 28 on the side close to the base substrate 10 is a, and the included angle $\alpha$ should be greater than 90° and less than 180°.

Specifically, an included angle $\alpha$ between the side edge 281 of the metal spacer 28 and the bottom surface of the metal spacer 28 on the side close to the base substrate 10 may be 95°, 100°, 120°, 135°, 150°, 160°, or 170°, etc.

Further, a thickness of the metal spacer 28 is greater than a thickness of the organic functional layer 32, and a thickness of the cathode 33 is greater than a thickness of the organic functional layer 32.

It should be noted that if the thickness of the organic functional layer 32 is greater than or equal to the thickness of the metal spacer 28, the metal spacer 28 can be completely covered by the organic functional layer 32, and the organic functional layer 32 will not form a fault at the side edge 281 of the metal spacer 28. If the thickness of the metal spacer 28 is greater than the thickness of the organic functional layer 32, it can be ensured that the organic functional layer 32 forms a fault at the side edge 281 of the metal spacer 28.

If the thickness of the cathode 33 is less than or equal to the thickness of the organic functional layer 32, there is a risk of a fault formed between a portion of the cathode 33 positioned on the side of the organic functional layer 32 facing away from the metal spacer 28 and other portions of the cathode 33. If the thickness of the cathode 33 is greater than the thickness of the organic functional layer 32, it can avoid an occurrence of a fault formed between the portion of the cathode 33 positioned on the side of the organic functional layer 32 away from the metal spacer 28 and other parts of the cathode 33.

Further, an orthographic projection of the metal spacer 28 on the base substrate 10 falls within an orthographic projection of the signal trace 204 on the base substrate 10.

As shown in FIG. 1 and FIG. 2, the width of the metal spacers 28 should be smaller than the width of the signal traces 204, so that the orthographic projection of the metal spacers 28 on the base substrate 10 can fall within the orthographic projection of the signal trace 204 on the base substrate 10, it can be ensured that both the organic functional layer 32 and the cathode 33 can be deposited on the signal trace 204 exposed by the fifth opening V5 when the organic functional layer 32 is formed by evaporation. Therefore, it is possible to avoid the formation of the fault due to the excessive step difference formed by the cathode 33 above the metal spacer 28 and the side edge of the metal spacer 28.

In one embodiment, the display panel further includes an auxiliary electrode, the auxiliary electrode is disposed on the passivation protection layer, and is connected to the source electrode through an opening formed on the passivation protection layer. The metal spacer and the auxiliary electrode are arranged on the same layer and have the same material as the auxiliary electrode.

Figure 3:
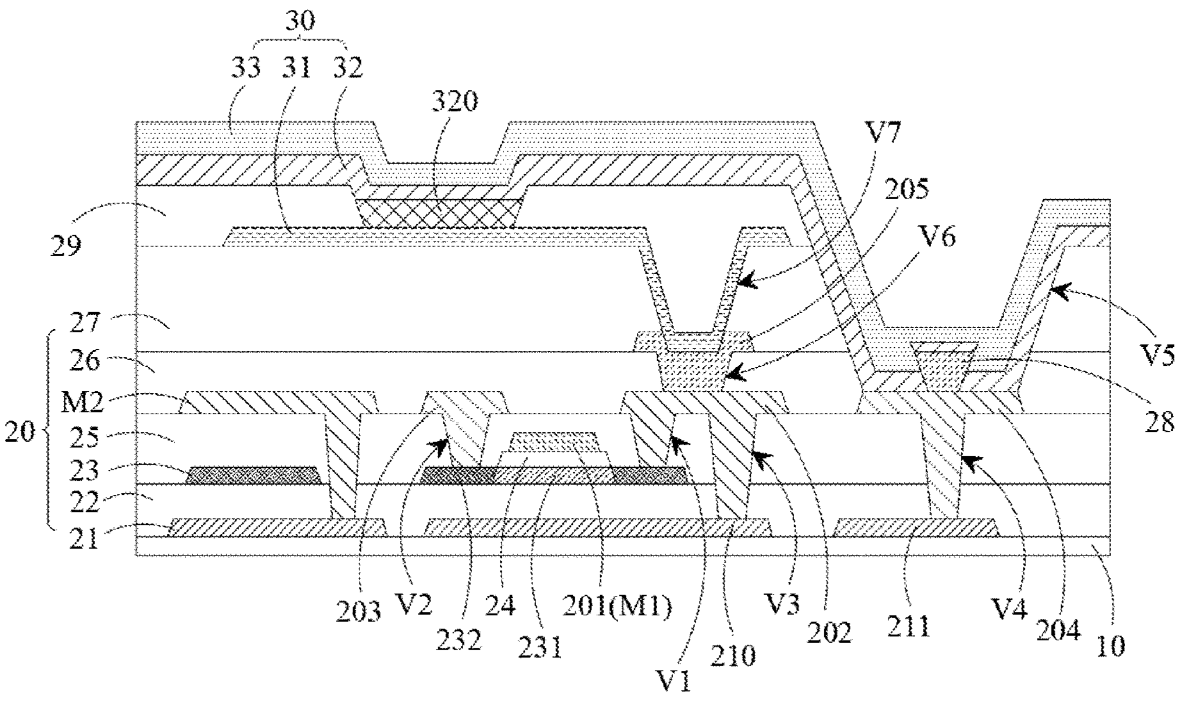
FIG. 3 is a schematic diagram of a stack structure of another display panel according to one embodiment of the present application.

As shown in FIG. 3, FIG. 3 is a schematic diagram of a stack structure of another display panel provided by one embodiment of the present application. The structure of the display panel shown in FIG. 3 is substantially the same as the structure of the display panel shown in FIG. 1. The difference is that the display panel further includes an auxiliary electrode 205, wherein the auxiliary electrode 205 is disposed on the passivation protection layer 26. A sixth opening V6 is formed on the passivation protection layer 26, wherein the sixth opening V6 exposes the source electrode 202 at the bottom of the passivation protection layer 26, and wherein the auxiliary electrode 205 is connected to the source electrode 202 passes through the sixth opening V6, and wherein the anode 31 is connected to the auxiliary electrode 205 through the seventh opening V7 on the planarization layer 27, so that the source electrode 202 can be electrically connected to the anode 31.

In the embodiment shown in FIG. 3, the auxiliary electrode 205 and the metal spacer 28 may be disposed on the second metal layer M2 exposed by the opening opened on the passivation protection layer 26, and may have same material as the metal spacer 28. In the actual manufacturing process, the metal spacer 28 and the auxiliary electrode 205 can be manufactured and formed through a same metal film manufacturing process.

Further, the auxiliary electrode 205 extends from the opening to the passivation protection layer 26 on an outer periphery of the opening.

As shown in FIG. 3, the auxiliary electrode 205 is not only disposed in the sixth opening V6 opened on the passivation protection layer 26, but also extends from the sixth opening V6 along a sidewall of the sixth opening V6 extending to the passivation protection layer 26 on the periphery of the sixth opening V6, in this way, the portion of the auxiliary electrode 205 extending to the passivation protection layer 26 on the outer periphery of the sixth opening V6 can be used to form a shield for the source electrode 202, so as to avoid damage to the source electrode 202 caused by subsequent processes, thereby preventing damage to the source electrode 202, it can ensure the stability of electrical performance of switching devices such as thin film transistors in the display panel.

According to the display panel provided by the above embodiments of the present application, the embodiments of the present application further provide a method of manufacturing the display panel. The method of manufacturing the display panel is used to manufacture and form the display panel described in the above embodiments. Combined with FIGS. 4*a* to 4*f*, FIGS. 4*a* to 4*f* are schematic structural diagrams of the flow of the method of manufacturing the display panel according to one embodiment of the present application, and the method of manufacturing the display panel includes the following steps:

Step S10: providing a substrate, the substrate comprises a base substrate 10 and a thin film transistor array layer 20 positioned on the substrate 10, wherein the thin film transistor array layer 20 includes an auxiliary cathode 211, a signal trace 204, and a passivation protection layer 26, wherein the auxiliary cathode 211 is disposed between the signal trace 204 and the base substrate 10, and electrically connected to the signal trace 204, wherein the passivation protection layer 26 is disposed on a side of the signal trace 204 away from the base substrate;

It should be noted that, for the structure of the thin film transistor array layer 20, reference may be made to the structure of the thin film transistor array layer 20 in FIG. 1 and FIG. 3 in the above-mentioned embodiments, which will not be repeated here.

Step S20: etching the passivation protection layer 26 to form an opening penetrating through the passivation protection layer 26, wherein the opening exposes part of the signal trace 204, and wherein a width of the opening gradually decreases from a side away from the base substrate to a side close to the base substrate.

Figure 4A:
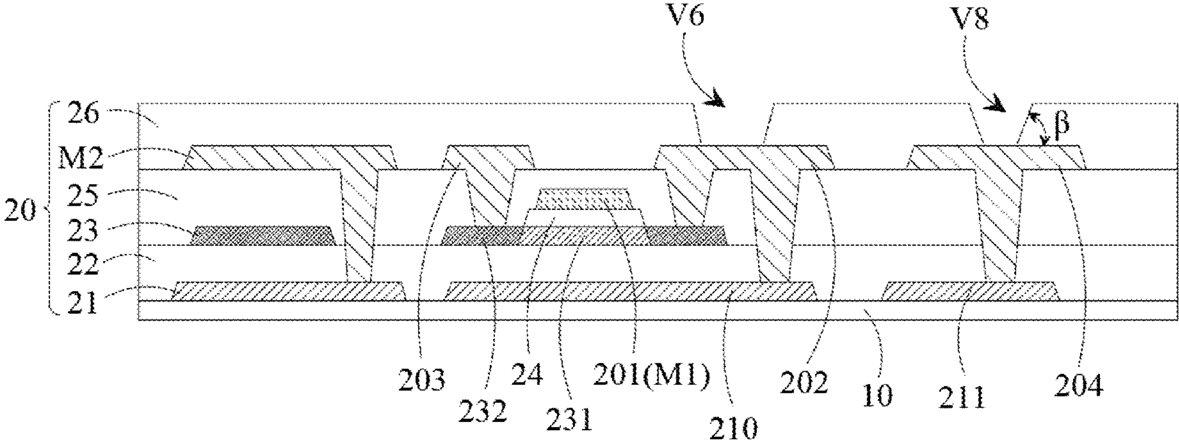
FIG. 4*a* to FIG. 4*f* are schematic flow charts of the manufacturing method of the display panel according to one embodiment of the present application.
Figure 4B:
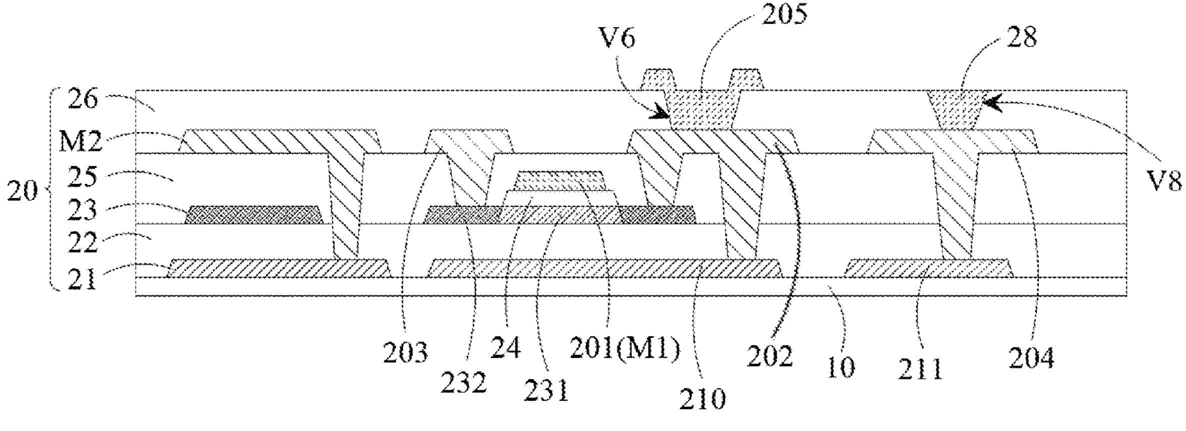

As shown in FIG. 4*a* and FIG. 4*b*, in the step S20, the passivation protection layer 26 is etched, and a sixth opening V6 and an eighth opening V8 are formed at the same time. The sixth opening V6 is shown to expose the source electrode 202 under the passivation protection layer 26. The eighth opening V8 exposes the signal traces 204 under the passivation protection layer 26.

Step S30: forming a metal spacer 28 on the signal trace at the opening.

The specific steps of the step S30 include: depositing a layer of metal material on the passivation protection layer 26; etching the metal material through a yellow photo etching process, forming a plurality of auxiliary electrodes at the sixth opening V6, and forming a plurality of metal spacers 28 at the eighth opening V8.

The auxiliary electrode 205 is formed in the sixth opening V6, and is extended along the sidewall of the sixth opening V6 to the passivation protection layer 26 on the outer periphery of the sixth opening V6, to block the source electrode 202 under the auxiliary electrode 205 to avoid damage to the source electrode 202 caused by subsequent processes.

The metal spacer 28 is only formed in the eighth opening V8, and is connected to the signal trace 204 exposed from the eighth opening V8.

In the embodiment of the present application, as shown in FIG. 4*a* and FIG. 4*b*, an included angle β is formed between a side edge of the eighth opening V8 and an upper surface of the signal trace 204, wherein the included angle β is less than 90°. Preferably, the included angle β should be greater than 60° and less than 90°. The included angle formed between the side edge of the eighth opening V8 and a bottom edge of the passivation protection layer 26 should be less than 90°. Therefore, the included angle formed between the side edge of the metal spacer 28 and the bottom edge of the metal spacer 28 on the side close to the base substrate 10 should be greater than 90°.

In the cross-sectional view shown in FIG. 4*b*, a cross-sectional shape of the metal spacer 28 is an inverted trapezoid.

Step S40: forming a planarization layer 27 on the passivation protection layer 26, and etching the planarization layer 27 to expose an upper surface of the metal spacer 28.

Figure 4C:
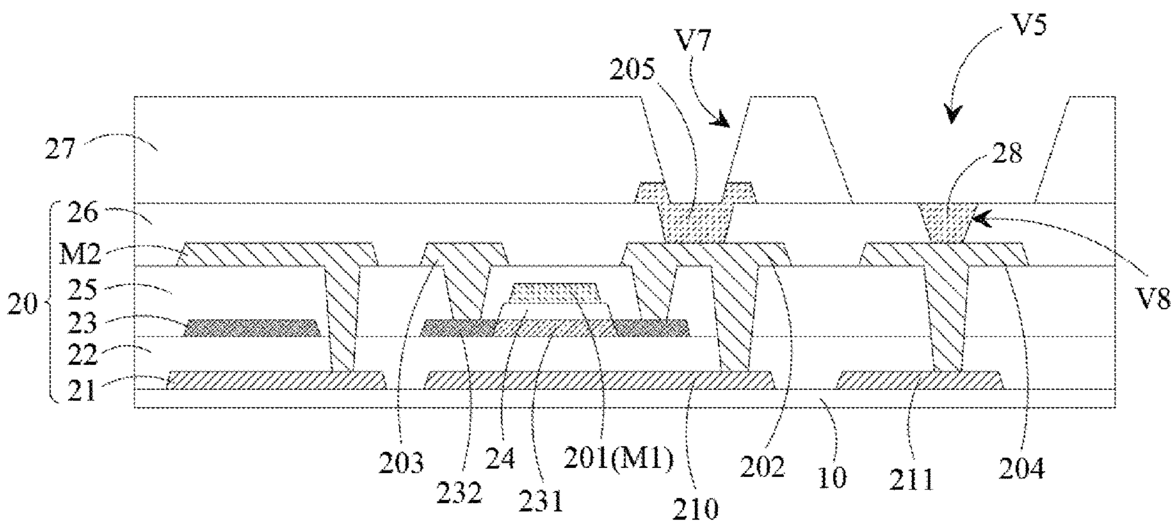

As shown in FIG. 4*c*, by etching the planarization layer 27, a seventh opening V7 and a fifth opening V5 are formed. The seventh opening V7 exposes the auxiliary electrode 205. The fifth opening V5 exposes an upper surface of the metal spacer 28 and the passivation protection layer 26 around the metal spacer 28.

Step S50: Etching the passivation protection layer 26 around the metal spacer 28 to expose the side edge of the metal spacer 28.

Figure 4D:
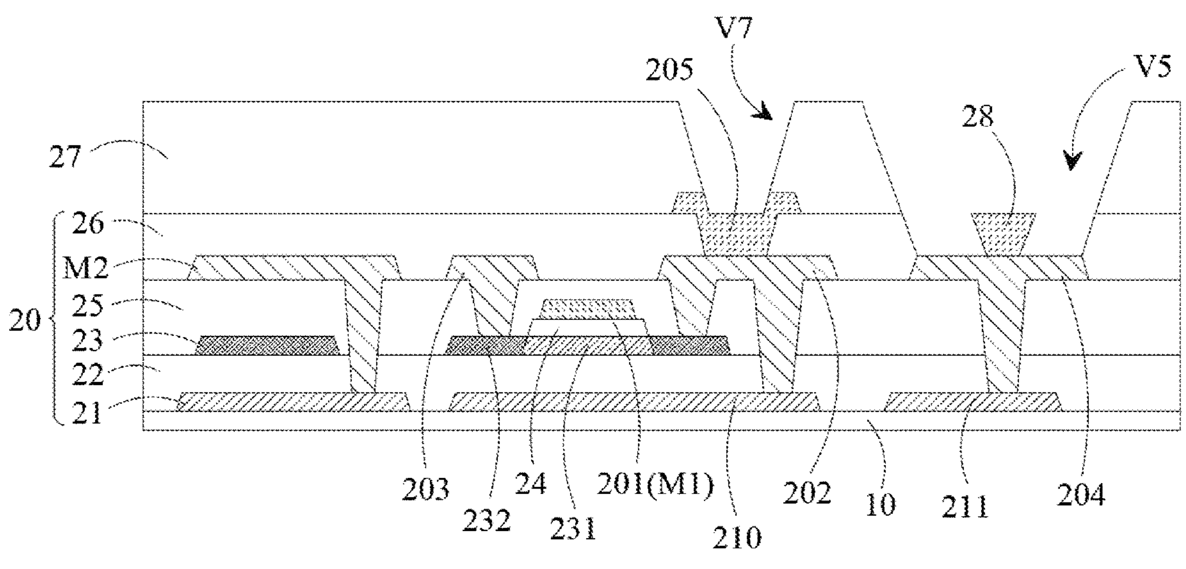

As shown in FIG. 4*d*, a material of the passivation protection layer 26 is silicon oxide (SiOx), and the passivation protection layer 26 exposed by the fifth opening V5 is etched by hydrofluoric acid (HF). The fifth opening V5 penetrates the passivation protection layer 26 and the planarization layer 27 to completely expose the metal spacer 28 and expose a side surface of the signal trace 204 positioned under the metal spacer 28 away from the base substrate 10.

Step S60: forming an anode 31 and a pixel definition layer 29 in sequence on the passivation protection layer, and etching the pixel definition layer 29 to expose the upper surface and the side edge of the metal spacer 28.

Figure 4E:
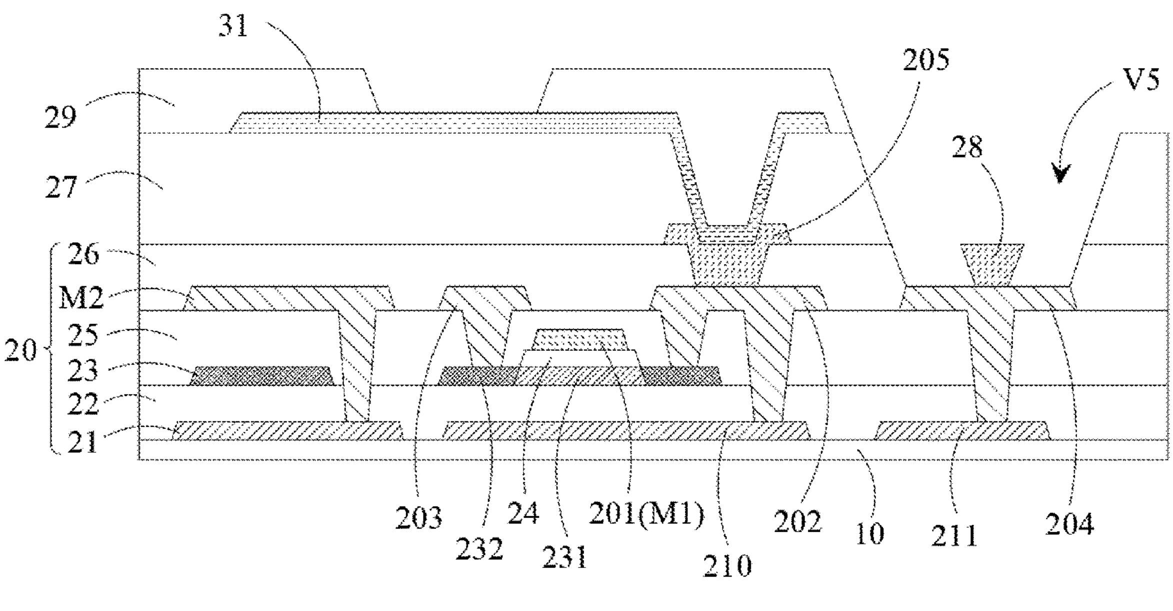

As shown in FIG. 4*e*, the step S60 specifically includes: first depositing a layer of conductive material on the planarization layer 27, and then etching the layer of conductive material to form a patterned anode 31; and coating a layer of organic material covering the anode 31 on the planarization layer 27, and then etching the layer of organic material to form a pixel opening exposing the anode 31, and then exposing the metal spacer 28 and the signal trace 204 which is under the metal spacer 28.

The conductive material of the anode 31 can be a metal material or a conductive metal oxide material.

Step S70: depositing an organic functional layer 32 on the pixel definition layer, wherein a portion of the organic functional layer 32 deposited and formed on the metal spacer 28 is disconnected from other portions, and wherein the side edge of the metal spacer 28 is exposed.

Step S80: depositing a cathode 33 on the organic functional layer 32, wherein the cathode 33 is connected to the side edge of the metal spacer 28.

Figure 4F:
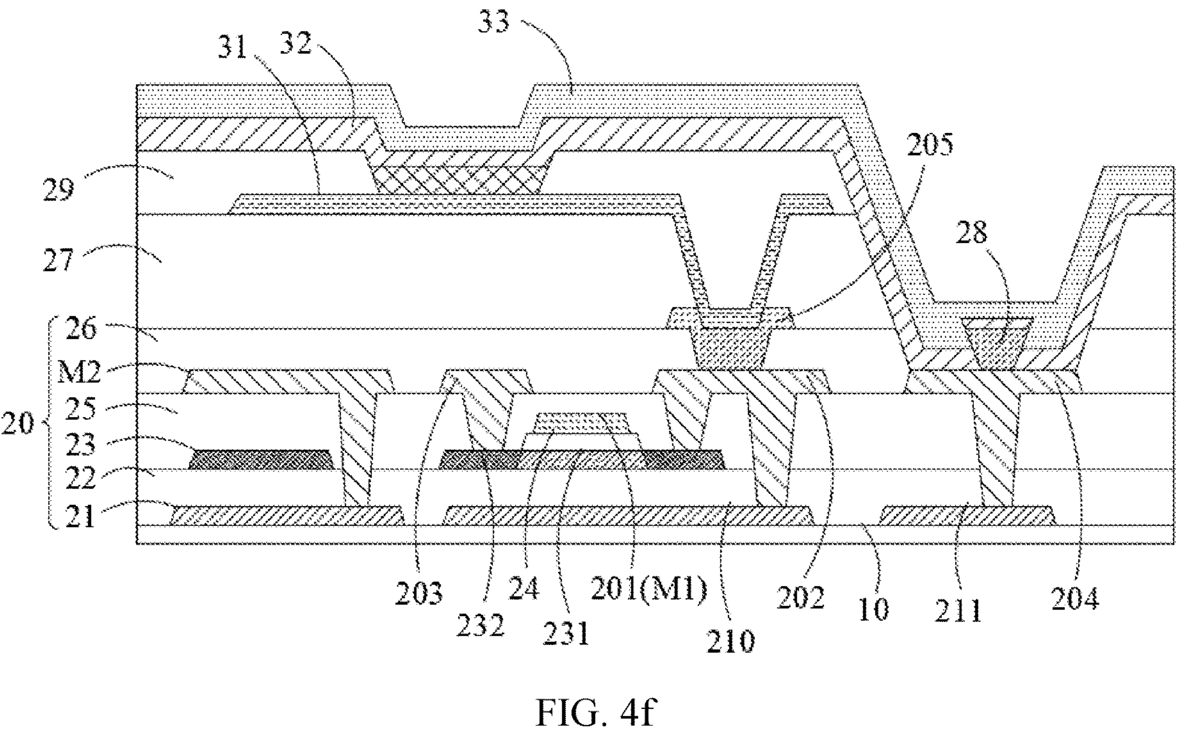

As shown in FIG. 4*f*, the organic functional layer 32 and the cathode 33 may be sequentially formed by evaporation over the entire surface, a portion of the organic functional layer 32 formed on a side of the metal spacer 28 facing away from the base substrate 10 is disconnected from a portion of the organic functional layer formed on a side of the signal trace 204 facing away from the base substrate 10, and a side edge of the metal spacer 28 is exposed. The cathode 33 formed by subsequent evaporation covers the organic functional layer 32 and is connected to the exposed side edge of the metal spacer 28.

With the method of manufacturing the display panel provided in the embodiment of the present application, the organic functional layer 32 can be formed with a fault on the side edge of the metal spacer 28 without etching the organic functional layer 32, and the cathode 33 can connect to the metal spacer 28 through the fault on the metal spacer 28 by the organic functional layer 32, so that the cathode 33 and the auxiliary cathode 211 are formed in parallel, thereby reducing a resistance in the circuit. Therefore, a voltage drop in the circuit can be reduced, and at the same time, a mask used for etching the organic functional layer and the related process can be saved, so that a manufacturing cost and process difficulty can be reduced, and a production efficiency can be improved.

According to the display panel provided by the above embodiments of the present application, the embodiments of the present application further provide an electronic device, the electronic device includes a casing, a circuit board, and a display panel provided by the above embodiments. The circuit board is disposed in the casing. The display panel is covered on the casing. The touch display panel is electrically connected to the circuit board.

The electronic device can be a mobile terminal, such as color electronic paper, color e-book, smart phone, etc. The electronic device can also be a wearable terminal, such as a smart watch, smart bracelet, etc., and the electronic device can also be a fixed terminal, such as color electronic billboards, color electronic posters, etc.

Beneficial effects of the embodiments of the present disclosure: The embodiments of the present application provide a display panel and a manufacturing method thereof, and an electronic device. The electronic device includes the display panel, and the display panel includes a base substrate, an auxiliary cathode on the base substrate, an anode on the base substrate, a metal spacer on the base substrate, and an organic functional layer and a cathode sequentially stacked on the anode and the metal spacer. The metal spacer is electrically connected to the auxiliary cathode. A part of the organic functional layer on the metal spacer is disconnected from other parts of the organic functional layer, wherein a side edge of the metal spacer is exposed, and wherein the cathode is connected to the side edge of the metal spacer. Therefore, there is no need to etch the organic functional layer. The cathode and the metal spacer can be directly connected when the cathode is formed by evaporation on the entire surface without the need for an additional mask and a process of etching the organic functional layer. Therefore, a manufacturing process can be simplified and a production cost can be reduced.

To sum up, although the present application discloses the preferred embodiments as above, the above preferred embodiments are not intended to limit the present application. Those of ordinary skill in the field can make various changes and modifications without departing from the spirit and scope of the present application, so the protection scope of the present application is based on a scope defined by the claims.

What is claimed is:

1. A method of manufacturing a display panel, comprising:

providing a substrate, wherein the substrate comprises a base substrate and a thin film transistor array layer positioned on the base substrate; the thin film transistor array layer comprises an auxiliary cathode, a signal trace, and a passivation protection layer; the auxiliary cathode is disposed between the signal trace and the base substrate, and electrically connected to the signal trace; the passivation protection layer is disposed on a side of the signal trace facing away from the base substrate;

etching the passivation protection layer to form an opening penetrating through the passivation protection layer, wherein the opening exposes part of the signal trace, and a width of the opening gradually decreases from a side away from the base substrate to a side close to the base substrate;

forming a metal spacer on the signal trace at the opening;

forming a planarization layer on the passivation protection layer, and etching the planarization layer to expose an upper surface of the metal spacer;

etching the passivation protection layer around the metal spacer to expose a side edge of the metal spacer;

forming an anode and a pixel definition layer in sequence on the passivation protection layer, and etching the pixel definition layer to expose the upper surface and the side edge of the metal spacer;

depositing an organic functional layer on the pixel definition layer, wherein a portion of the organic functional layer deposited and formed on the metal spacer is disconnected from other portions of the organic functional layer, and the side edge of the metal spacer is exposed; and depositing a cathode on the organic functional layer, wherein the cathode is connected to the side edge of the metal spacer;

wherein a thickness of the metal spacer is greater than a thickness of the organic functional layer;

wherein a thickness of the cathode is greater than a thickness of the organic functional layer at every point on the organic functional layer;

wherein a width of the metal spacer gradually decreases from an end away from the base substrate to an end close to the base substrate, such that the side edge of the metal spacer has a bevel surface; and the other portions of the organic functional layer extend to and are in contact with the bevel surface of the metal spacer.

2. The method of manufacturing the display panel according to claim 1, wherein an included angle between a side edge of the opening and an upper surface of the signal trace is less than 90°.

3. The method of manufacturing the display panel according to claim 1, wherein the display panel comprises a source electrode and a drain electrode, wherein the signal trace, the source electrode, and the drain electrode are disposed in a same layer, and wherein the signal trace, the source electrode, and the drain electrode have a same material.

4. The method of manufacturing the display panel according to claim 3, wherein the passivation protection layer and the planarization layer are sequentially stacked on the source electrode and the drain electrode.

5. The method of manufacturing the display panel according to claim 4, wherein the display panel further comprises an auxiliary electrode, wherein the auxiliary electrode is disposed on the passivation protection layer and connected to the source electrode by a second opening formed on the passivation protection layer;

wherein the metal spacer and the auxiliary electrode are disposed on a same layer and have a same material.

6. The method of manufacturing the display panel according to claim 5, wherein the auxiliary electrode extends from the second opening to the passivation protection layer on an outer periphery of the second opening.

7. The method of manufacturing the display panel according to claim 1, wherein an included angle between the side edge of the metal spacer and a bottom surface on a side of the metal spacer close to the base substrate is greater than 90° and less than 180°.

8. The method of manufacturing the display panel according to claim 3, wherein an orthographic projection of the metal spacer on the base substrate falls within an orthographic projection of the signal trace on the base substrate.

* * * * *